(12) United States Patent
Barwicz

(10) Patent No.: US 11,063,406 B1
(45) Date of Patent: Jul. 13, 2021

(54) CONFIGURATION FOR LOW-RIPPLE OPTICAL GAIN WITH SINGLE-FACET SEMICONDUCTOR OPTICAL AMPLIFIERS

(71) Applicant: Acacia Communications, Inc., Maynard, MA (US)

(72) Inventor: Tymon Barwicz, Holmdel, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 16/893,341

(22) Filed: Jun. 4, 2020

(51) Int. Cl.
  *H04B 10/25* (2013.01)
  *H04B 10/564* (2013.01)
  *H01S 5/50* (2006.01)
  *H01S 5/10* (2021.01)

(52) U.S. Cl.
  CPC ........... *H01S 5/101* (2013.01); *H01S 5/50* (2013.01); *H04B 10/25* (2013.01); *H04B 10/564* (2013.01)

(58) Field of Classification Search
  None
  See application file for complete search history.

(56) References Cited

U.S. PATENT DOCUMENTS

| | | | | |
|---|---|---|---|---|
| 5,434,702 A * | 7/1995 | Byron | ............... | H01S 3/10023 359/337.21 |
| 6,438,291 B1 * | 8/2002 | Duck | ............... | G02B 6/125 385/24 |
| 8,355,605 B1 * | 1/2013 | Wach | ............... | H04B 10/07 385/16 |
| 9,568,682 B1 | 2/2017 | Barwicz et al. | | |
| 9,716,367 B2 | 7/2017 | Barwicz et al. | | |
| 9,885,835 B2 | 2/2018 | Barwicz et al. | | |
| 10,026,852 B2 | 7/2018 | Assefa et al. | | |
| 10,284,300 B2 | 5/2019 | Chen et al. | | |
| 10,302,859 B1 * | 5/2019 | Martin et al. | .......... | G02B 6/125 |
| 10,416,393 B2 | 9/2019 | Barwicz et al. | | |
| 10,444,429 B1 | 10/2019 | Martin et al. | | |
| 10,490,971 B2 | 11/2019 | Barwicz et al. | | |
| 10,527,787 B1 | 1/2020 | Martin et al. | | |
| 10,534,140 B2 | 1/2020 | Barwicz et al. | | |
| 10,546,962 B2 | 1/2020 | Assefa et al. | | |
| 2005/0111848 A1 * | 5/2005 | Grubb | ............... | H04J 14/0221 398/147 |
| 2006/0093360 A1 * | 5/2006 | Kim | ............... | H04J 14/02 398/71 |
| 2009/0092354 A1 * | 4/2009 | Joyner | ............... | G02B 6/12004 385/14 |
| 2014/0348461 A1 * | 11/2014 | Budd | ............... | G02B 6/12 385/14 |
| 2017/0139237 A1 * | 5/2017 | Luo | ............... | G02F 1/011 |

* cited by examiner

*Primary Examiner* — Darren E Wolf
(74) *Attorney, Agent, or Firm* — Joseph D'Angelo

(57) ABSTRACT

A semiconductor optical amplifier having a 3 dB coupler is described for use in providing an amplified optical data signal to a photonic chip. The semiconductor optical amplifier includes an amplifier die having a signal coupling facet, waveguides terminating at the signal coupling facet, a 3 dB coupler, and a reflector. The 3 dB coupler is optically coupled between the signal coupling facet and the reflector.

21 Claims, 10 Drawing Sheets

CONFIGURATION FOR LOW-RIPPLE OPTICAL GAIN WITH SINGLE-FACET SEMICONDUCTOR OPTICAL AMPLIFIERS

BACKGROUND

Field

The present application relates to semiconductor optical amplifiers used to provide gain for optical signals.

Related Art

A semiconductor optical amplifier optically couples with optical fibers or a photonic chip to provide gain for optical signals. One type of semiconductor optical amplifier has an optical input on one facet of a semiconductor chip and an optical output at an opposite facet of the semiconductor chip. Such a configuration may be used to connect with optical fibers, where a fiber is connected to each facet of the semiconductor optical amplifier.

BRIEF SUMMARY

A semiconductor optical amplifier having a 3 dB coupler optically coupled between a signal coupling facet and a reflector is described. The semiconductor optical amplifier may allow for waveguides at a region proximate to the signal coupling facet to propagate optical signals in a unidirectional manner, which may reduce the impact of undesired reflections that may otherwise contribute to gain ripple in comparison to a reflective semiconductor optical amplifier without a 3 dB coupler.

In some embodiments, a semiconductor optical amplifier is provided. The semiconductor optical amplifier comprises an amplifier die having a signal coupling facet, waveguides terminating at the signal coupling facet, a 3 dB coupler, and a reflector. The 3 dB coupler is optically coupled between the signal coupling facet and the reflector.

In some embodiments, an optical system is provided. The optical system comprises a semiconductor optical amplifier and a photonic chip. The semiconductor optical amplifier comprises an amplifier die having a signal coupling facet, waveguides terminating at the signal coupling facet, a reflector on the amplifier die, and a 3 dB coupler on the amplifier die. The 3 dB coupler is optically coupled to the signal coupling facet and the reflector. The photonic chip is configured to transmit an optical data signal to the signal coupling facet and receive an amplified optical data signal from the signal coupling facet.

In some embodiments, a method of amplifying an optical signal is provided. The method comprises receiving an optical data signal by a semiconductor optical amplifier. The semiconductor optical amplifier has a gain region, a reflector, and a 3 dB coupler optically coupled to the gain region and the reflector. The method further comprises propagating the optical data signal through an optical path that includes the gain region, the 3 dB coupler, and the reflector to generate an amplified optical data signal, and transmitting the amplified optical data signal.

BRIEF DESCRIPTION OF DRAWINGS

Various aspects and embodiments of the application will be described with reference to the following figures. It should be appreciated that the figures are not necessarily drawn to scale. Items appearing in multiple figures are indicated by the same reference number in all the figures in which they appear.

DETAILED DESCRIPTION

Figure 1A:
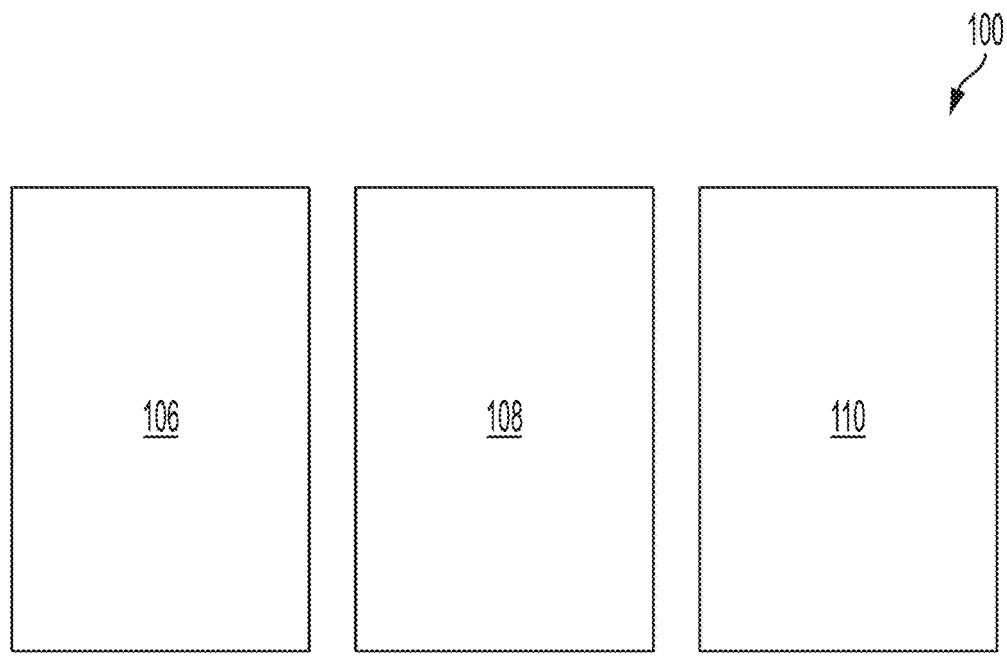
FIG. 1A is a block diagram of a gain region, a 3 dB coupler, and a reflector included in a semiconductor optical amplifier.

Aspects of the present application relate to a semiconductor optical amplifier having a 3 dB coupler on an amplifier die (e.g., a semiconductor die). The semiconductor optical amplifier also includes one or more reflectors. The 3 dB coupler and the one or more reflector have a configuration that allows light to propagate in a unidirectional manner along waveguides in a region proximate to a signal coupling facet of the amplifier die, which may reduce undesired reflections and allow one waveguide to act as an input for an optical data signal and another waveguide to act as an output of an amplified optical data signal. The signal coupling facet may be configured to optically couple with a photonic chip to receive the input optical data signal from the photonic chip and transmit the amplified optical data signal to the photonic chip. A semiconductor optical amplifier as described herein may be implemented in a variety of optical systems, including various telecommunication systems.

A semiconductor optical amplifier as described herein may provide certain benefits and improvements over conventional semiconductor optical amplifiers both in its ability to interface with a photonic chip and its performance in amplifying optical data signals. As opposed to having separate facets for the input and output optical signals, where an optical signal is input through one facet and an amplified optical signal is received as an output through an opposing facet, aspects of the present application provide semiconductor optical amplifiers where the optical signal enters and exits the amplifier at a same facet. Configurations using opposite facets for entry and exit of the optical signal present difficulties in aligning both facets of the semiconductor optical amplifier with a photonic chip because the relative sizing of the photonic chip and the semiconductor optical amplifier may be imprecise. Gaps may be present between the photonic chip and one or both of the facets, which may result in optical loss when coupling optical signals between the photonic chip and the semiconductor optical amplifier. In contrast, a configuration utilizing the same signal coupling facet of the amplifier die for both input of the optical signal and output of the amplified optical signal may provide for simpler and more precise manufacture. The single coupling facet configuration allows for some size tolerance of the amplifier die and the photonic chip.

Furthermore, aspects of the present application provide semiconductor optical amplifiers in which the optical signals propagate in one direction through the coupling facet. Implementing an optical amplifier with a single facet configuration by including a reflector, such as a high reflective coating, to reflect optical signals back towards the coupling facet, may exhibit signal performance problems because of the bidirectional propagation of the optical signals at the coupling facet. Such bidirectional propagation can create difficulties in separating the amplified optical signal from the input optical signal. Separation of the amplified optical signal from the input optical signal may occur on the photonic chip, which may have additional features to perform this capability and add complexity to the photonic chip. For example, the photonic chip may include a signal separating circuit to separate the amplified optical signal from the input optical signal. In addition, undesired reflections arising from the optical signal propagating along the bidirectional waveguides and reflecting both at the coupling facet and the reflector generate noise in the amplified optical signal. In particular, the amplified optical signal may have significant spectral gain ripple in comparison to a semiconductor optical amplifier with a configuration having both an input facet and an output facet.

A semiconductor optical amplifier as described herein provides improved performance by having waveguides configured to propagate optical signals unidirectionally at least within a region at the signal coupling facet. Reflections occurring at the signal coupling facet may contribute to spectral ripple gain by being back propagated to a reflector. Hence, to reduce the impact of reflections at the coupling facet from contributing to the spectral gain ripple, aspects of the present application relate to optical amplifiers having a configuration that allows for unidirectional propagation at the coupling facet. In some embodiments, an optical amplifier having a one-facet configuration as described herein may have a sufficiently low spectral gain ripple. In some instances, the optical amplifier having a one-facet configuration may have a similar or lower spectral gain ripple in comparison to an optical amplifier having a single facet configuration where the waveguides at the single facet may propagate optical signals bidirectionally.

According to aspects of the present application, the semiconductor optical amplifier includes a 3 dB coupler optically coupled between a signal coupling facet and the reflector. The 3 dB coupler allows waveguides in a region proximate to the signal coupling facet to act as unidirectional waveguides. The 3 dB coupler may be configured as a four port device to approximately evenly split an optical signal propagating along any of the two ports on a first side between the two ports on a second side of the 3 dB coupler, such that each port on the second side receives approximately 50% of the optical signal. In some embodiments of the semiconductor optical amplifier described herein, the 3 dB coupler may be configured to receive optical signals from a waveguide in a gain region and split the optical signals into two branches such that each of the two branches receives approximately 50% of the optical signals. The split optical signals are reflected by the reflector and the reflected optical signals are combined by the 3 dB coupler into another waveguide of the gain region, which acts as an output for the amplified optical signal.

The extent to which the reflected signals are combined into a single waveguide may depend on a phase difference between the reflected signals. The 3 dB coupler may have a configuration where optical signals propagating along two branches are constructively combined into an output branch. Accordingly, some aspects of the present application relate to semiconductor optical amplifier configurations that allow for the reflected optical signals to have a sufficient phase difference to allow for desired routing of the optical signals. In some embodiments, the optical distances between the 3 dB coupler and the reflector for both branches are approximately equal. In some embodiments, the semiconductor optical amplifier may include an optical phase shifter, which may be used to adjust the phase of an optical signal propagating along one of the branches.

In some embodiments, the 3 dB coupler is a 3 dB directional coupler. The 3 dB directional coupler may be configured to provide a phase shift of $\pi/2$ to an optical signal crossing from one branch to another branch of the 3 dB directional coupler, which can be used to provide the functionality of separating between input and output optical signals. In particular, if a first branch has an optical phase ahead of a second branch by $(4n-3)\pi/2$ where $n=0, 1, 2, 3$ . . . the power will be transferred into the first branch. However, if the first branch has an optical phase behind the second branch by $(4n-3)\pi/2$ where $n=0, 1, 2, 3$ . . . , the power will be transferred to the second branch.

In some embodiments, the 3 dB coupler is a 3 dB adiabatic coupler. The 3 dB adiabatic coupler and an additional phase shift element, such as a small extra length of waveguide, may achieve the desired phase relationship between the ports to allow for separation between input and output signals. In a 3 dB adiabatic coupler, when the signals on both branches are in phase ($2n\pi$ where $n=0, 1, 2, 3$) maps to the highest effective index mode and the signals are guided to the widest output. However, when the signals are out of phase ($(2n-1)\pi$ where $n=0, 1, 2, 3$) maps to the lowest effective index mode and the signals are guided to the narrowest output.

According to some aspects of the present application, the 3 dB coupler may be positioned in close proximity to the reflector such that the gain region occupies a majority of the footprint of the amplifier die. Such a configuration may reduce the optical distance over which control of the relative phase difference between the split optical signals is needed to reduce optical losses arising from the 3 dB coupler splitting and combining optical signals. In some embodiments, the gain region may be more than half a length of the amplifier die between the signal coupling facet and an edge opposite the signal coupling facet.

The aspects and embodiments described above, as well as additional aspects and embodiments, are described further below. These aspects and/or embodiments may be used individually, all together, or in any combination of two or more, as the application is not limited in this respect.

FIG. 1A is a block diagram of semiconductor optical amplifier 100. Semiconductor optical amplifier 100 includes gain region 106, 3 dB coupler 108, and reflector 110. It should be appreciated that FIG. 1A is illustrative of the functional capabilities of semiconductor optical amplifier 100 and that any suitable arrangement of gain region 106, 3 dB coupler 108, and reflector 110 on an amplifier die may provide some or all of the benefits described above.

As used herein a "gain region" may refer to a region of an amplifier die that primarily provides optical gain to optical signals. It should be appreciated that other regions of an amplifier die than those identified as a gain region may also provide optical gain to optical signals. In some embodiments, optical gain is applied throughout the amplifier die and not only in the gain region. In some embodiments, the gain region may predominately provide the optical gain to the optical signals while other regions may provide optical gain to a lesser extent. In some embodiments, the gain region may be positioned between a signal coupling facet and a 3 dB coupler. In some embodiments, the gain region may be positioned between a 3 dB coupler and a reflector.

Figure 1B:
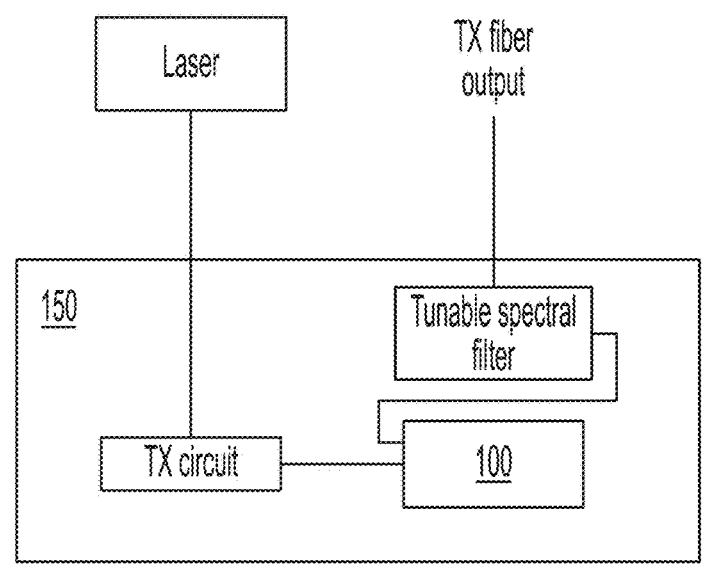
FIG. 1B is an optical system that includes a photonic chip optically coupled to a semiconductor optical amplifier.

FIG. 1B is a schematic of an optical system that includes semiconductor optical amplifier 100 and photonic chip 150. Photonic chip 150 may be configured to transmit an optical data signal to semiconductor optical amplifier 100 and receive an amplified optical data signal from semiconductor optical amplifier 100. Photonic chip 150 may be a silicon-based photonic integrated circuit (PIC) that includes one or more photonic components integrated on a silicon substrate. As shown in FIG. 1B, photonic chip 150 may include a transmitter (TX) circuit and a tunable spectral bandpass filter, which may be configured to attenuate optical noise originating from amplified spontaneous emission in semiconductor optical amplifier 100. In addition, one or more optical components may be located off of photonic chip 150. As shown in FIG. 1B, a laser may be located off of photonic chip 150. Other components that may be located off-chip include an isolator and fiber couplers.

Figure 2A:
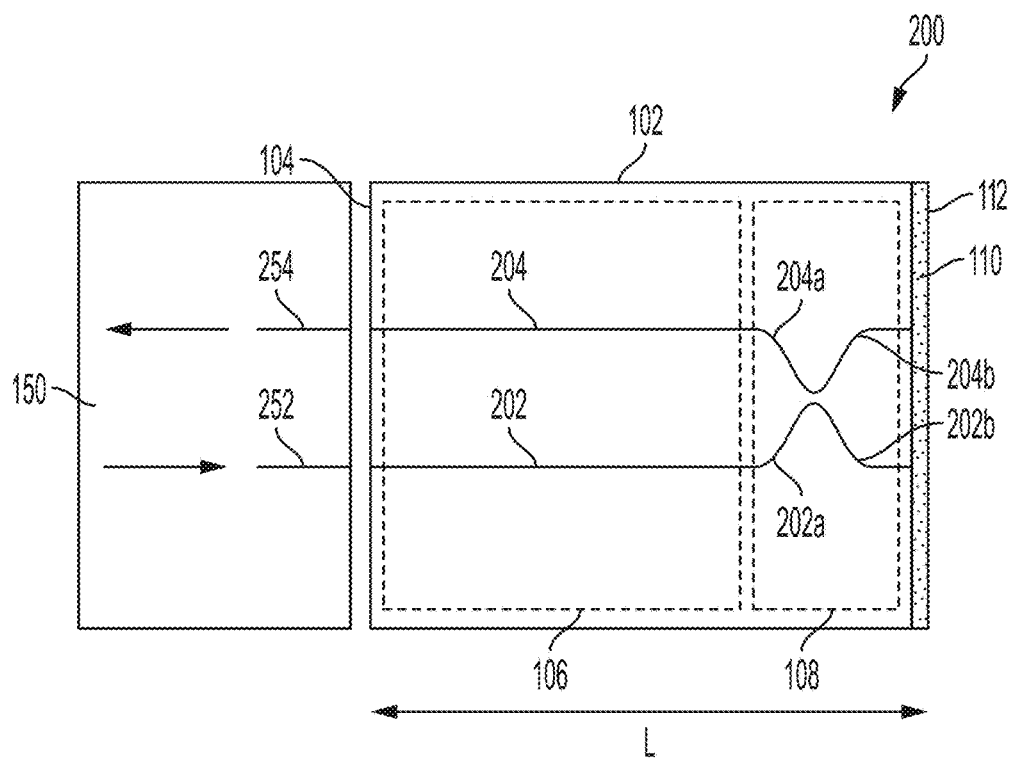
FIG. 2A is a top view of a semiconductor optical amplifier having a gain region, a 3 dB coupler, and a reflector.

FIG. 2A is a top view of semiconductor optical amplifier 200 optically coupled to photonic chip 150. Semiconductor optical amplifier 200 includes amplifier die 102 having signal coupling facet 104, where gain region 106, 3 dB coupler 108, and reflector 110 are formed on amplifier die 102. Signal coupling facet 104 may optically couple with photonic chip 150, which may transmit an optical data signal to semiconductor optical amplifier 200 and receive an amplified optical data signal from semiconductor optical amplifier 200 (as indicated by the arrows shown in FIG. 2A). Amplifier die 102 may have a length, L, between signal coupling facet 104 and edge 112, which is opposite to signal coupling facet 104. In some embodiments, gain region 106 may be more than half of length, L. In some embodiments, amplifier die 102 may include one or more III-V semiconductor materials. Examples of III-V semiconductor materials that may be included in amplifier die 102 are GaN, GaAs, InP, InAs, AlGaAs, AlGaInAs, InGaAs, and InGaAsP.

Semiconductor optical amplifier 200 includes waveguides 202 and 204 that terminate at signal coupling facet 104. Photonic chip 150 includes waveguides 252 and 254, which terminate at a facet that is positioned to optically couple with signal coupling facet 104. As shown in FIG. 2A, waveguide 252 may provide an input optical data signal to semiconductor optical amplifier 200, such as by optically coupling the optical data signal into waveguide 202. Amplification of the optical data signal may occur by propagating the optical data signal along a path that includes gain region 106, 3 dB coupler 108, and reflector 110 to generate an amplified optical data signal. Waveguide 254 may receive the amplified optical data signal from waveguide 204 through signal coupling facet 104.

Reflector 110 is formed on edge 112 of amplifier die 102 opposite to signal coupling facet 104. In some embodiments, reflector 110 is a reflective coating formed on the edge of amplifier die 102 opposite to signal coupling facet 104. In some embodiments, signal coupling facet 104 may have an anti-reflective coating.

Referring again to FIG. 2A, in gain region 106, waveguides 202 and 204 are configured to propagate optical signals along a direction between signal coupling facet 104 and reflector 110. In some embodiments, gain region 106 may extend over half a length, L, of amplifier die 102. In such embodiments, the sections of waveguides 202 and 204 in gain region 106 extend more than half of length, L, of amplifier die 102. In some embodiments, waveguides 202 and 204 are configured to propagate light in a single direction relative to 3 dB coupler 108 at least in a region between signal coupling facet 104 and 3 dB coupler 108. For example, waveguide 202 may be configured to propagate light towards 3 dB coupler 108 and waveguide 204 may be configured to propagate light away from 3 dB coupler 108. In some embodiments, waveguides 202 and 204 are single mode waveguides.

As shown in FIG. 2A, waveguides 202 and 204 are configured to optically couple to form 3 dB coupler 108. In particular, waveguides 202 and 204 are positioned to optically couple along a coupling length. Sections of waveguides 202 and 204 on either side of the coupling length may be considered as "branches" of 3 dB coupler 108. For example, waveguide sections 204a and 202a may be considered as branches of 3 dB coupler 108 proximate to gain region 106 and waveguide sections 204b and 202b may be considered as branches of 3 dB coupler 108 proximate to reflector 110. As shown in FIG. 2A, branches 204b and 202b each have an end positioned proximate to reflector 110.

According to aspects of the present application, 3 dB coupler 108 may have a configuration that approximately evenly splits optical signals propagating along one branch of 3 dB coupler 108 between two branches on an opposite side of 3 dB coupler 108. In such instances, the two branches each receive approximately 50% of the optical signals. For example, an optical signal propagating along waveguide 202 towards 3 dB coupler 108 may be input to branch 202a, and 3 dB coupler 108 may approximately evenly split the optical signal between branches 204b and 202b. In this context, "approximately 50%" may be used to mean within ±0.1% of an even split of the optical signals in some embodiments, within ±0.3% of an even split of the optical signals in some embodiments, within ±1% of an even split of the optical signals in some embodiments, within ±5% of an even split of the optical signals in some embodiments, and within ±10% of an even split of the optical signals in some embodiments. In some embodiments, 3 dB coupler 108 is configured to have an optical power coupling coefficient of approximately 0.5.

It should be appreciated that different types of optical couplers may be implemented in a semiconductor optical amplifier as described herein. In some embodiments, 3 dB coupler 108 is a 3 dB directional coupler. In some embodiments, 3 dB coupler 108 is a 3 dB adiabatic coupler. According to some embodiments, 3 dB coupler 108 may have a configuration that allows for combining optical signals propagating along two branches on one side of the 3 dB coupler where the optical signals have a phase shift difference of approximately $(4n-3)\pi/2$, where n is a positive integer.

Figure 2B:
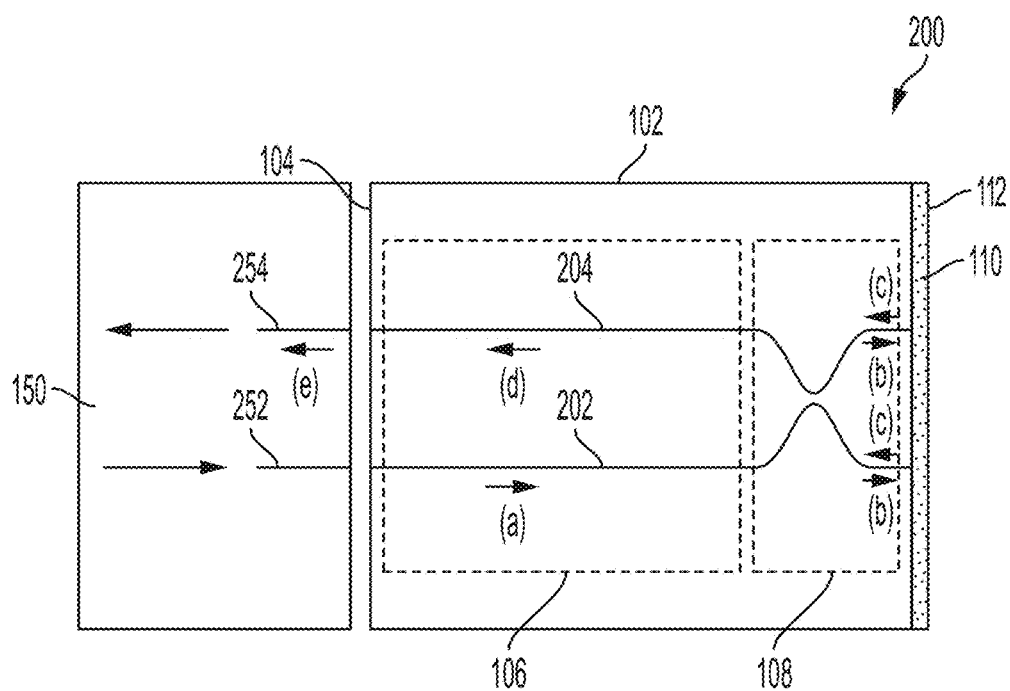
FIG. 2B illustrates how optical data signals propagate through the semiconductor optical amplifier shown in FIG. 2A.

FIG. 2B illustrates how optical data signals propagate through semiconductor optical amplifier 200 shown in FIG. 2A. As shown in FIG. 2B, an optical data signal is received by semiconductor optical amplifier 200 into waveguide 202 through signal coupling facet 104 from photonic chip 150. The optical data signal propagates along waveguide 202 in gain region 106 towards 3 dB coupler 108, as indicated by path (a). The optical data signal then propagates through 3 dB coupler 108 towards reflector 110. As described herein, propagating the optical data signal through 3 dB coupler 108 involves splitting the optical data signal between branches 204b and 202b, which are indicated by path (b). The split optical signals are reflected by reflector 110 back towards 3 dB coupler 108, as indicated by path (c). The reflected optical signals are propagated through 3 dB coupler 108 towards gain region 106. Propagating the reflected optical signals through 3 dB coupler 108 involves combining the optical signals into waveguide 204, which is indicated by path (d). Amplification of the optical data signal occurs throughout propagation of the optical data signal such that the optical signal transmitted from semiconductor optical amplifier 200 is an amplified optical data signal. As shown in FIG. 2B, the amplified optical data signal is transmitted from waveguide 204 to waveguide 254 of photonic chip 150 through signal coupling facet 104, which is indicated by path (e).

The phase difference between the reflected optical signals propagating through branches 204b and 202b may impact the extent to which the reflected optical signals constructively interfere and combine into waveguide 204. Accordingly, in some embodiments, semiconductor optical amplifier 200 has a configuration that allows for a phase difference between the reflected optical signals propagating through branch 204b and the reflected optical signals propagating through branch 202b such that the reflected optical signals in both branches 202b and 204b substantially combine into waveguide 204. The reflected optical signals in branches 202b and 204b may have the phase difference at a location in 3 dB coupler 108 where combination of the reflected optical signals occurs. In embodiments where 3 dB coupler 108 is a 3 dB directional coupler, a phase difference between the reflected optical signals in branches 202b and 204b may be approximately $(4n-3)\pi/2$ at the return to the 3 dB directional coupler. In embodiments where 3 dB coupler 108 is a 3 dB adiabatic coupler a phase difference between the reflected optical signals in branches 202b and 204b may be approximately $(2n-1)\pi$ at the return to the 3 dB adiabatic coupler where waveguide 202 is wider than waveguide 204 or approximately $(2n)\pi$ at the return to the 3 dB adiabatic coupler where waveguide 204 is wider than waveguide 202. In some embodiments, the optical path distances of the optical signals split by 3 dB coupler 108 and reflected by reflector 110 back to 3 dB coupler 108 are approximately the same. In some embodiments, branch 204b has an optical path distance and branch 202b has approximately the same optical path distance.

Figure 2C:
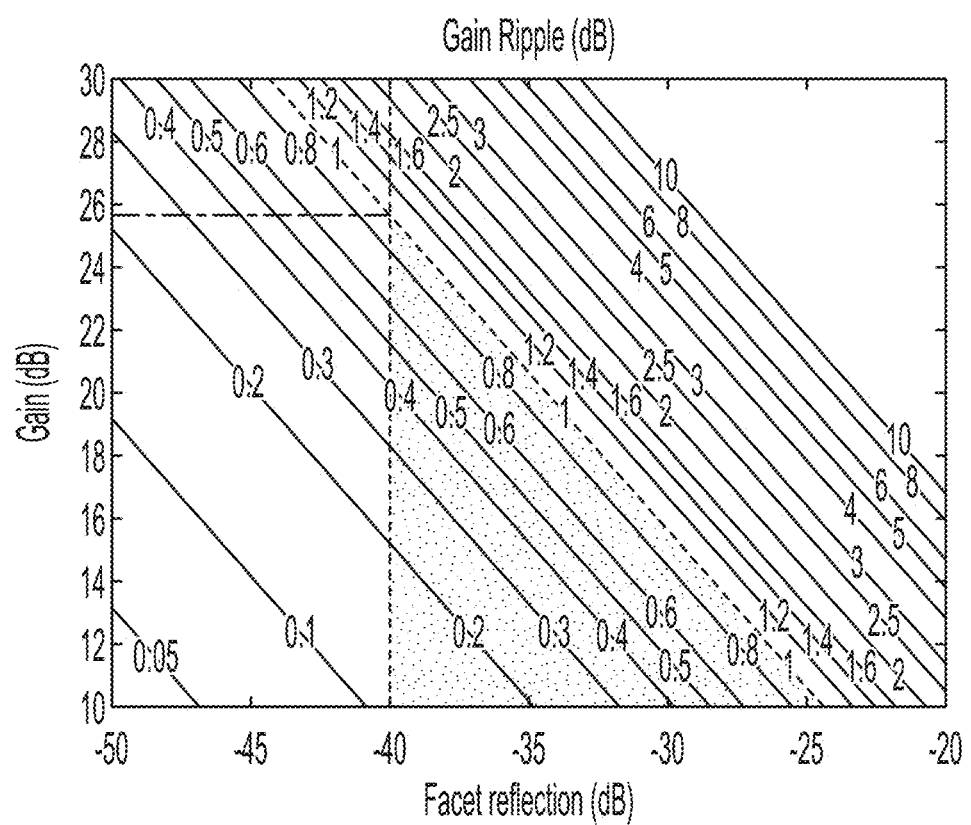
FIG. 2C is a plot of spectral gain ripple at various amounts of facet reflection and optical gain for a semiconductor optical amplifier having a configuration as shown in FIG. 2A.

FIG. 2C is a plot of spectral gain ripple for different amounts of optical gain and facet reflection by performing a model of a semiconductor optical amplifier having a configuration as shown in FIG. 2A. In the model, an assumption of 1% imperfection in the separation of the input and output signals of the semiconductor optical amplifier was used. The y-axis is optical gain and the x-axis is facet reflections. The different lines correspond to resulting amounts of spectral gain ripple from the combination of optical gain and facet reflection in decibels as indicated by the numbers labeling the lines. This plot illustrates how high optical gain can be achieved using a semiconductor optical amplifier having a configuration as shown in FIG. 2A. In some instances, it is desired to operate a semiconductor optical amplifier such that the facet reflection is greater than −40 dB and the spectral gain ripple is less than 1 dB. In particular, a desired signal integrity is achieved when spectral gain ripple below 1 dB and it is difficult to achieve facet reflections below −40 dB. This performance region is illustrated in FIG. 2C by the dotted triangular region having the x-axis, the 1 dB spectral gain ripple line, and the vertical line intersecting at −40 dB facet reflection as borders. As shown in FIG. 2C, when operating under these performance constraints an optical gain between 25 dB and 26 dB can be achieved. This optical gain is significantly higher in contrast to other optical amplifiers having a single facet configuration.

Figure 2D:
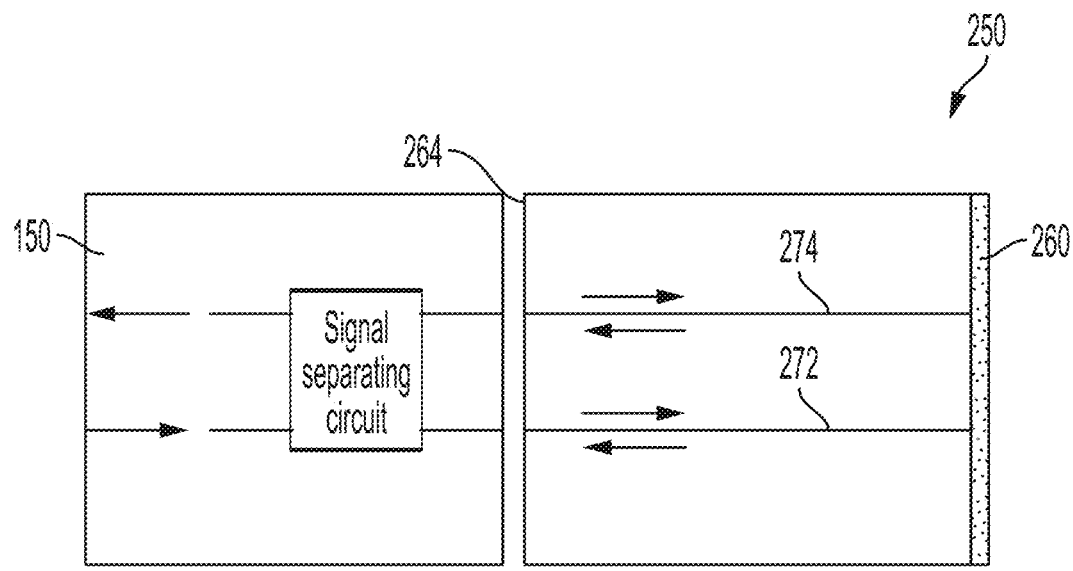
FIG. 2D is a top view of a semiconductor optical amplifier having a single facet configuration where waveguides propagate optical signals bidirectionally at the coupling facet and a plot of spectral gain ripple at various amounts of facet reflection and optical gain for the semiconductor optical amplifier.
Figure 2D:
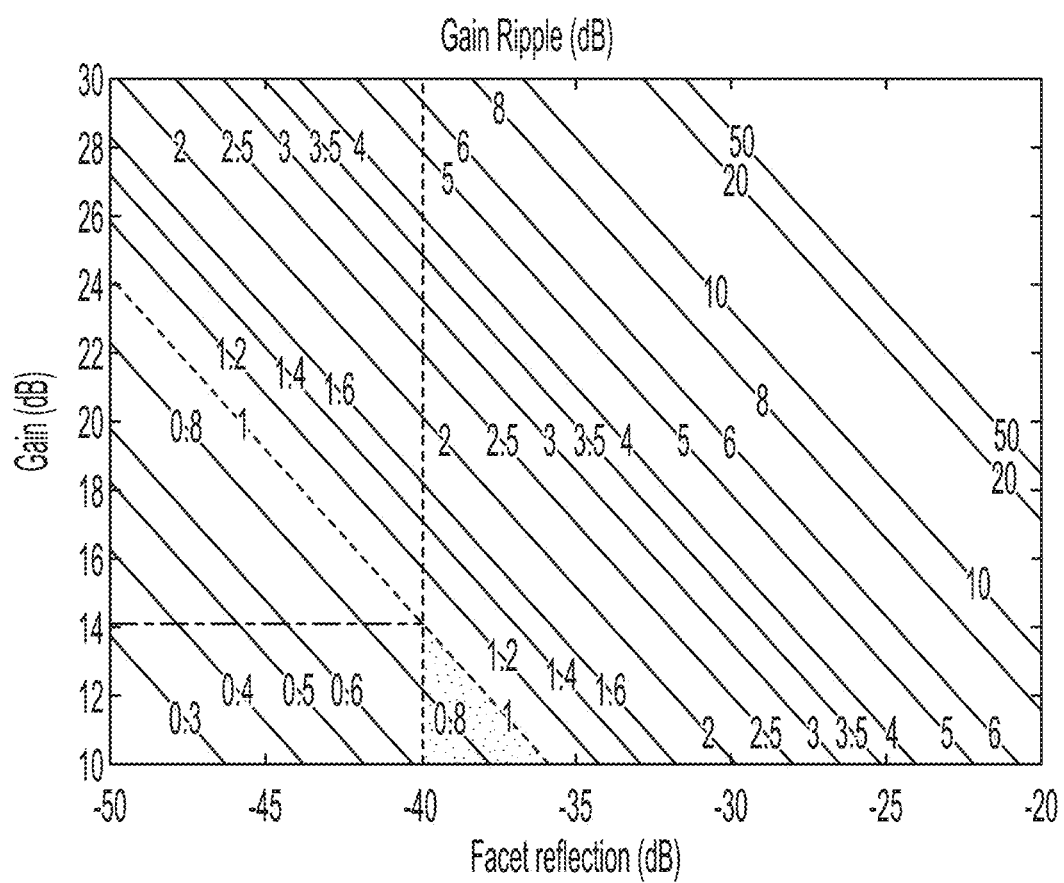

For example, FIG. 2D is top view of optical amplifier 250 having signal coupling facet 264, waveguides 272 and 274, and reflector 260. Waveguides 272 and 274 are configured to propagate optical signals bidirectionally (as shown by the arrows on optical amplifier 250), including at signal coupling facet 264. Photonic chip optically couples to optical amplifier 250 through signal coupling facet 264 and may include signal separating circuit to separate the amplified optical signal from the input optical signal (as shown by the arrows on photonic chip 150). FIG. 2D shows a plot of spectral gain ripple for different amounts of optical gain and facet for an optical amplifier having a configuration as shown by optical amplifier 250. Similar to FIG. 2C, a performance region illustrated by the dotted region having the x-axis, the 1 dB spectral gain ripple line, and the vertical line intersecting at −40 dB facet reflection as borders is shown. Here, the highest optical gain that can be achieved when operating under these performance constraints is approximately 14 dB. This amount of optical gain may be too low for some applications.

Figure 3A:
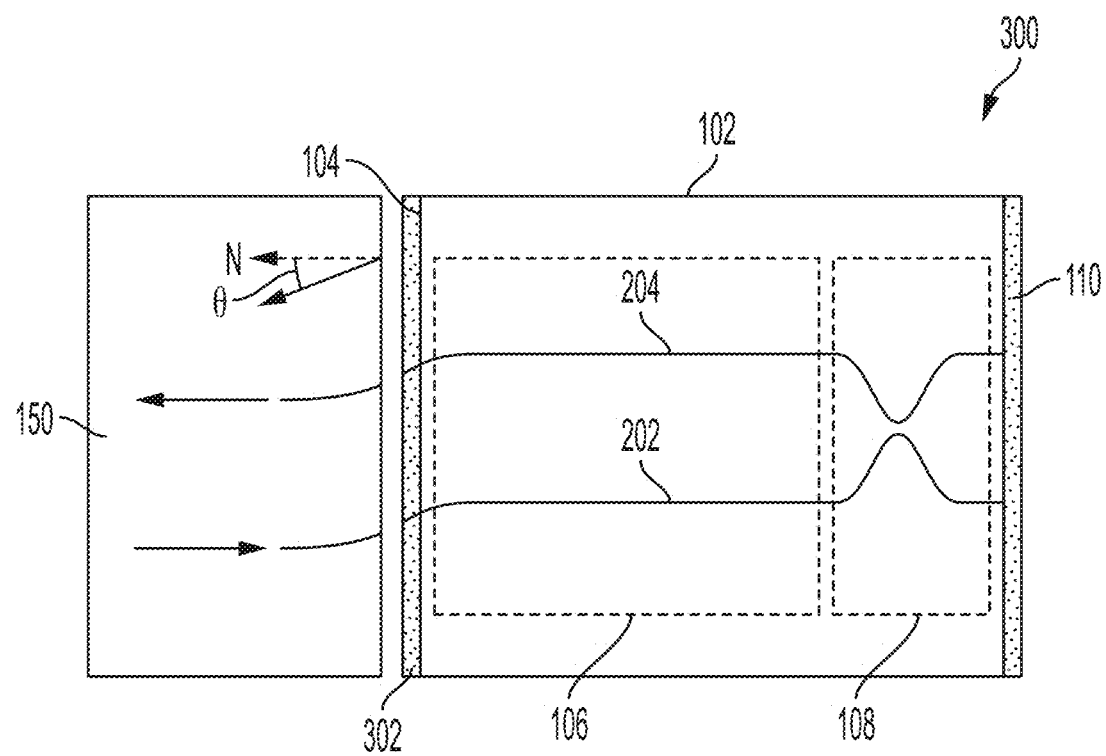
FIG. 3A is a top view of a semiconductor optical amplifier having a gain region, a 3 dB coupler, and a reflector, where waveguides are angled at a signal coupling facet.

FIG. 3A is a top view of semiconductor optical amplifier 300. As shown in FIG. 3A, semiconductor optical amplifier 300 includes anti-reflection coating 302 on signal coupling facet 104. Anti-reflection coating 302 may reduce reflections of optical signals at signal coupling facet 104.

Waveguides 202 and 204 of semiconductor optical amplifier 300 are angled proximate to signal coupling facet 104. As shown in FIG. 3A, waveguides 202 and 204 proximate to signal coupling facet 104 are at an angle, $\theta$, from a normal direction, N, of signal coupling facet 104. In some embodiments, angle, $\theta$, is at least 6 degrees. In some embodiments, angle, $\theta$, is at least 8 degrees. In some embodiments, angle, $\theta$, is at least 12 degrees. In some embodiments, the angle of the waveguides near the coupling facet 104 may be different on amplifier die 102 and photonic die 105 for optimal coupling performance.

Figure 3B:
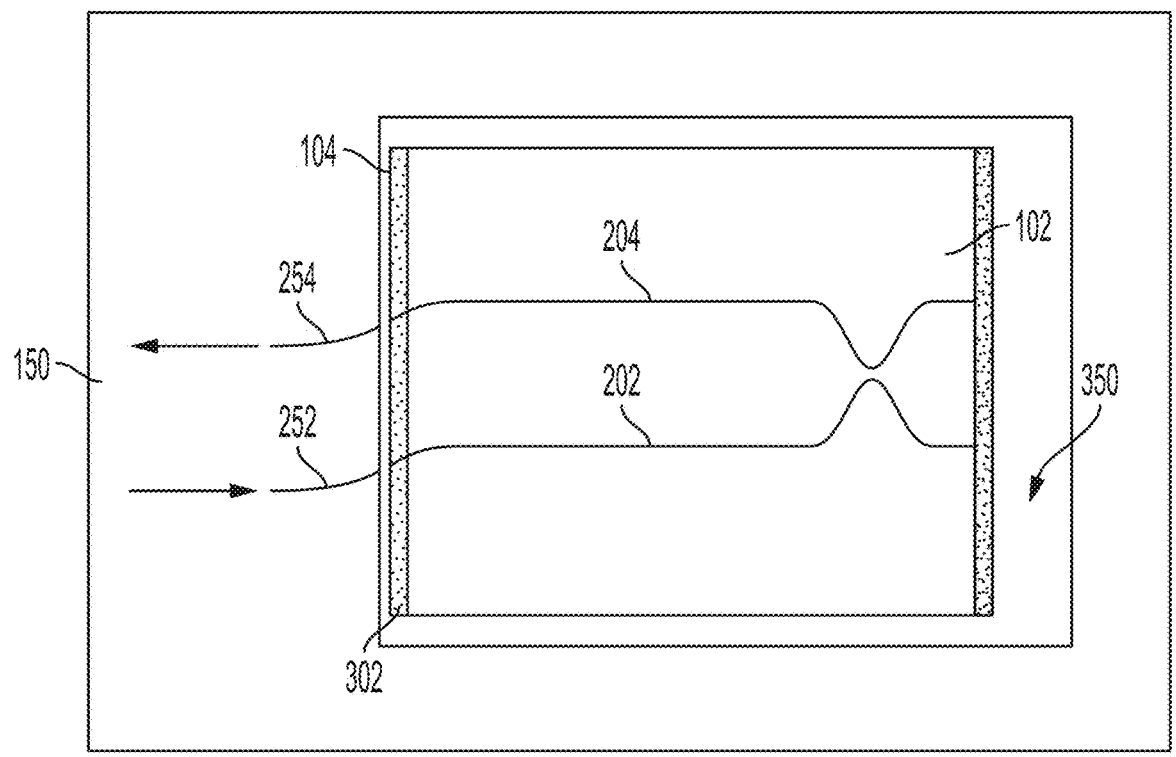
FIG. 3B is a top view of an optical system where the semiconductor optical amplifier shown in FIG. 3A is mounted on a photonic chip and optically coupled to the photonic chip.

According to some embodiments, a semiconductor optical amplifier described herein may be implemented in an optical system having a photonic chip where the semiconductor optical amplifier is flip-chip bonded to the photonic chip. FIG. 3B is a top view of an optical system that includes semiconductor optical amplifier 300 shown in FIG. 3A. In addition to semiconductor optical amplifier 300, the optical system includes photonic chip 150, which has recessed cavity 350. FIG. 3B shows amplifier die 102 positioned in recessed cavity 350 such that signal coupling facet 104 aligns to a facet of photonic chip 150 and waveguides 252 and 254 are positioned to optical couple with waveguides 202 and 204, respectively.

Figure 3C:
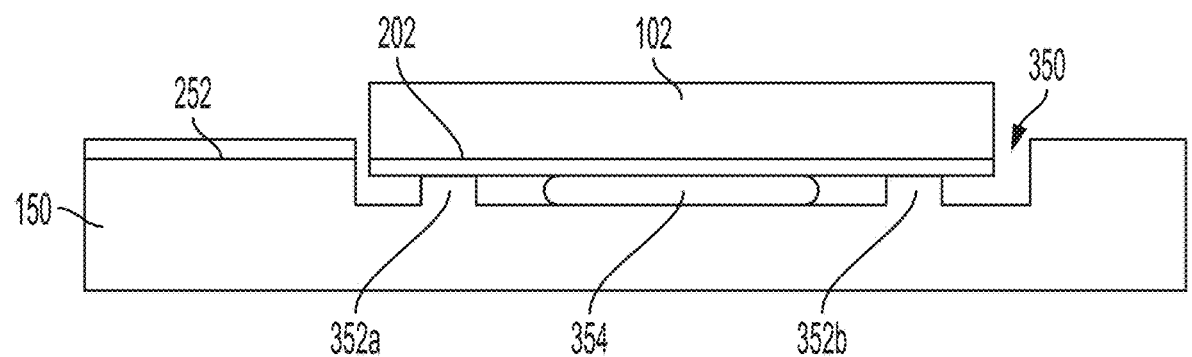
FIG. 3C is a side view of the optical system shown in FIG. 3B.

FIG. 3C is a side cross-sectional view of the optical system shown in FIG. 3B illustrating how semiconductor optical amplifier 300 is flip-chip bonded to photonic chip 150. Stand-offs, including stand-offs 352a and 352b, are formed in recessed cavity 350. The stand-offs may act to position semiconductor optical amplifier 300 into alignment with photonic chip 150. As shown in FIG. 3C, solder 354 may be used to connect semiconductor optical amplifier 300 to photonic chip 150.

Figure 4:
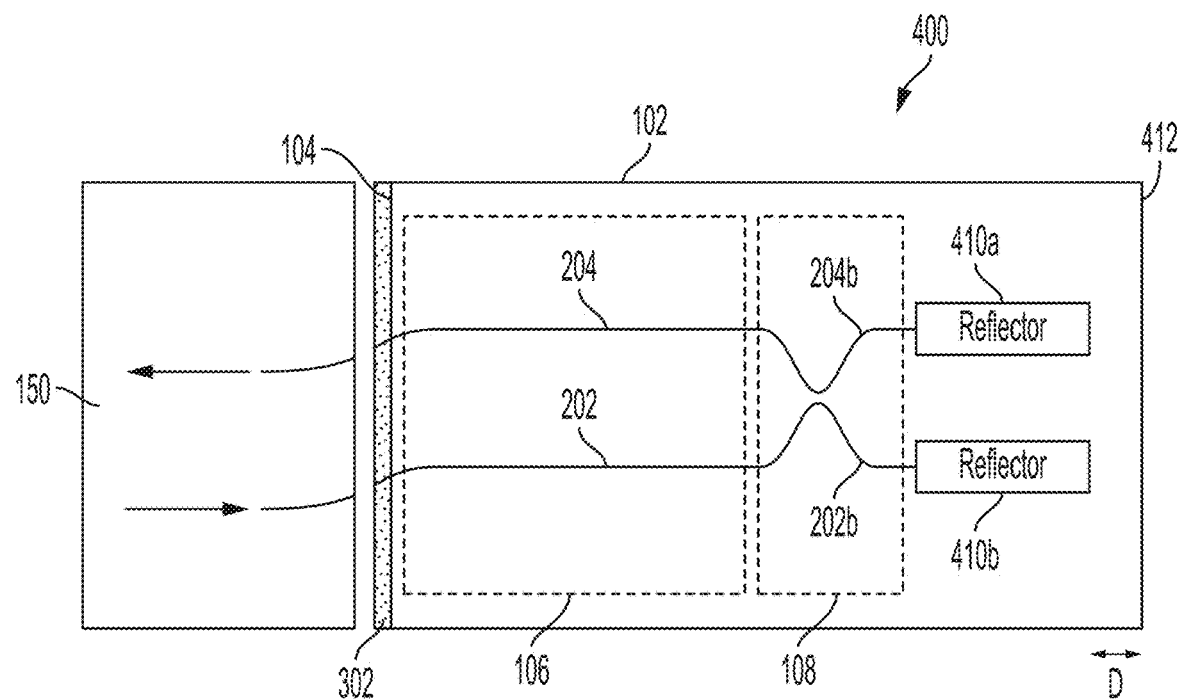
FIG. 4 is a top view of a semiconductor optical amplifier having a gain region, a 3 dB coupler, and two reflectors offset from an edge of an amplifier die.

FIG. 4 is a top view of semiconductor optical amplifier 400 having reflectors 410a and 410b. 3 dB coupler 108 is optically coupled between gain region 106 and both reflectors 410a and 410b. In some embodiments, reflectors 410a and 410b may be formed on amplifier die 102 using suitable lithography techniques. The lithographically-formed reflectors 410a and 410b may allow for improved control of the relative optical paths of branches 202b and 204b of 3 dB coupler 108 in comparison to die singulation where imperfections, such as angle or roughness, may be present on a die edge. In some embodiments, one or both of reflectors 410a and 410b include an etched waveguide facet structure having a high reflectivity coating. In some embodiments, one or both of reflectors 410a and 410b include an etched grating reflector. Reflectors 410a and 410b are formed proximate to 3 dB coupler 108 and offset a distance, D, from edge 412 of amplifier die 102. Distance, D, may be in the range of 10 μm to 100 μm, or any value within the range, from edge 412. In some embodiments, distance, D, is approximately 10 μm from edge 412. In some embodiments, distance, D, is approximately 100 μm from edge 412.

Figure 5:
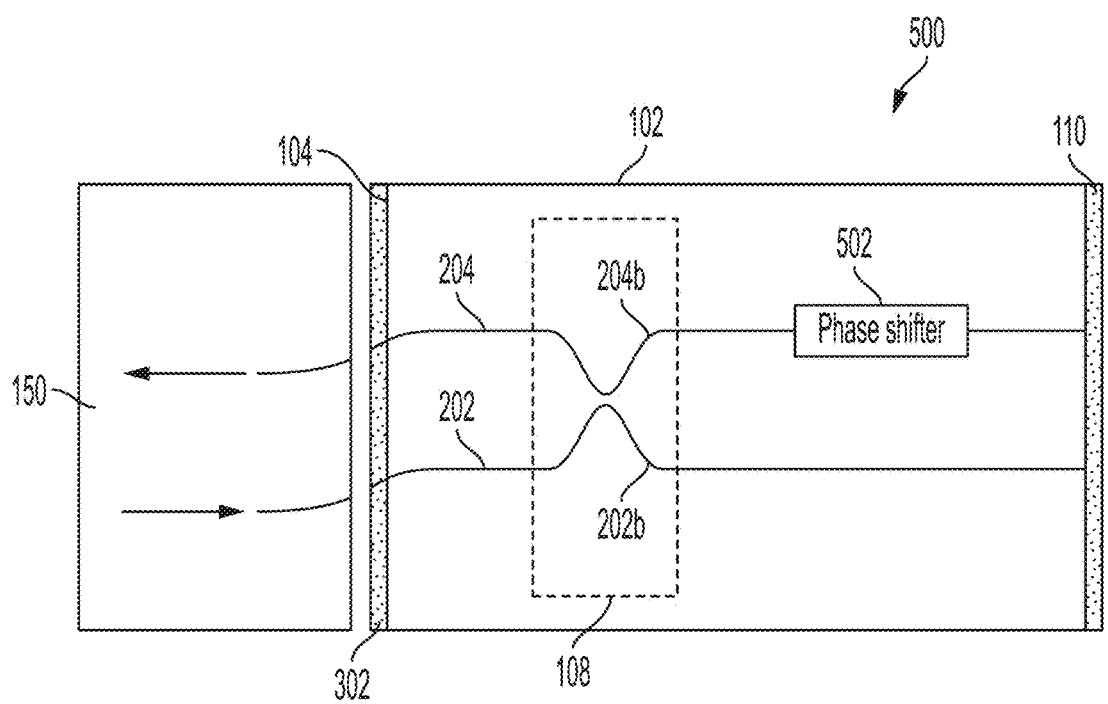
FIG. 5 is a top view of a semiconductor optical amplifier having a 3 dB coupler, an optical phase shifter, and a reflector.

FIG. 5 is a top view of semiconductor optical amplifier 500 having optical phase shifter 502 optically coupled between 3 dB coupler 108 and reflector 110. As shown in FIG. 5, optical phase shifter 502 is positioned along branch 204b and may be configured to modify the phase of optical signals propagating along branch 204b. For example, optical phase shifter 502 may act to modify a phase of optical signals propagating along branch 204b such that when the optical signals combine with optical signals propagating along branch 202b, a relative phase difference between the two optical signals is approximately $2n\pi$. In some embodiments, optical phase shifter 502 may be a dynamic phase shifter. A dynamic phase shifter may modify the phase of an optical signal based on some input, such as through temperature tuning or carrier injection. In some embodiments, optical phase shifter 502 may be a static phase shifter. Optical gain may occur predominately in a region of amplifier die 102 between 3 dB coupler 108 and reflector 110 that includes optical phase shifter 502, and thus may be considered as a gain region. In some embodiments, optical phase shifter 502 may be located on branch 202b. In some embodiments, optical phase shifter 502 may be located on branch 204.

In some embodiments, the 3 dB coupler has a tunable interferometric coupler configuration, which includes two or more optical couplers and one or more optical phase shifters. The tunable interferometric coupler configuration may reduce optical loss that would otherwise occur in splitting and combining optical signals by allowing trimming of the coupling ratios. It should be appreciated that a 3 dB coupler having a tunable interferometric coupler configuration may be implemented in combination with other features of the semiconductor optical amplifier described herein.

Figure 6:
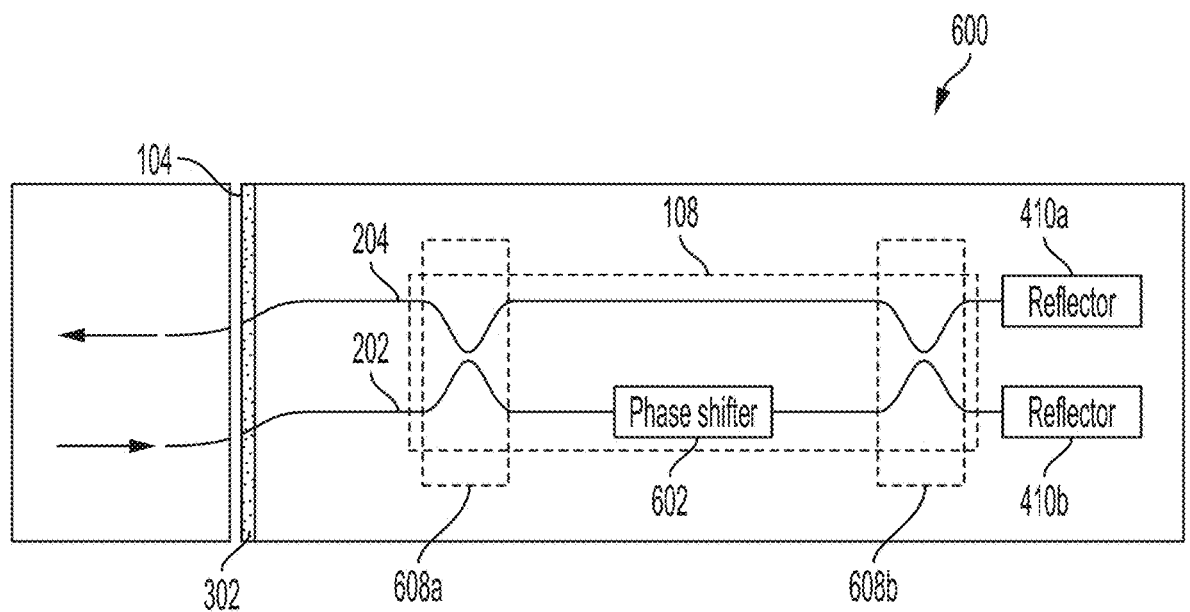
FIG. 6 is a top view of a semiconductor optical amplifier having a tunable interferometric coupler configuration that includes two optical couplers and an optical phase shifter and two reflectors offset from an edge of an amplifier die.

FIG. 6 is a top view of semiconductor optical amplifier 600 where 3 dB coupler 108 has a tunable interferometric coupler configuration and includes reflectors 410a and 410b, as described above in connection with FIG. 4. Semiconductor optical amplifier 600 includes optical couplers 608a and 608b optically coupled between signal coupling facet 104 and reflectors 410a and 410b. Semiconductor optical amplifier 600 also includes optical phase shifter 602 optically coupled between optical coupler 608a and optical coupler 608b. As shown in FIG. 6, optical phase shifter 602 is positioned along waveguide 202 between optical coupler 608a and optical coupler 608b. In some embodiments, a region of semiconductor die 102 between optical couplers 608a and 608b that includes phase shifter 602 may be considered as a gain region. In some embodiments, optical phase shifter 602 is positioned along waveguide 204 between optical couplers 608a and 608b. In some embodiments, optical couplers 608a and 608b are directional couplers. In some embodiments, optical couplers 608a and 608b are adiabatic couplers. In some embodiments, optical couplers 608a and 608b are 3 dB couplers.

Figure 7:
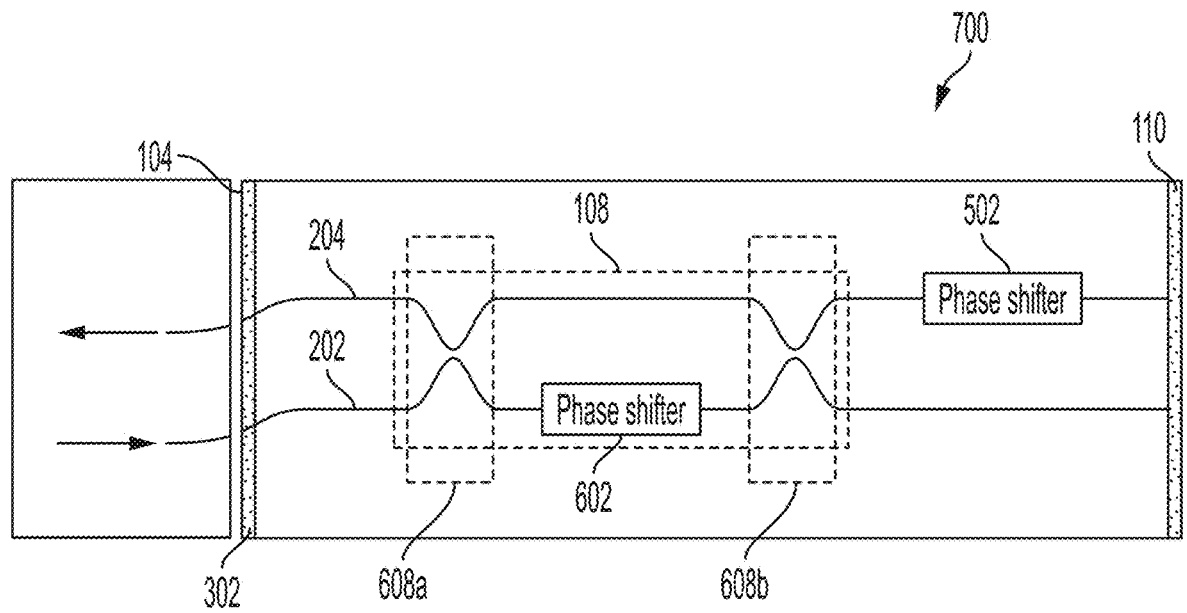
FIG. 7 is a top view of a semiconductor optical amplifier having an optical phase shifter and a tunable interferometric coupler configuration that includes two optical couplers and an optical phase shifter.

FIG. 7 is a top view of semiconductor optical amplifier 700 where 3 dB coupler 108 has a tunable interferometric coupler configuration as described in connection with FIG. 6 and optical phase shifter as described above in connection with 502. As shown in FIG. 7, semiconductor optical amplifier 700 includes optical couplers 608a and 608b optically coupled between signal coupling facet 104 and reflector 110.

Figure 8A:
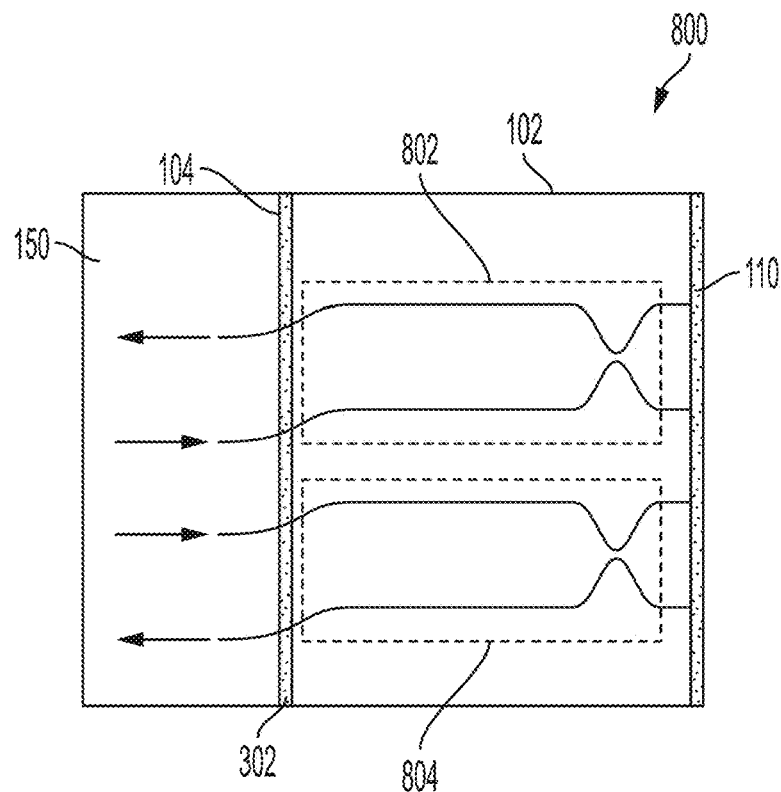
FIG. 8A is a top view of a semiconductor optical amplifier having two optical data signal channels.

Some embodiments of the present application relate to implementing one or more of the semiconductor optical amplifiers as multiple channels on the same amplifier die such that the channels are configured to receive and amplify different optical data signals. FIG. 8A is a top view of semiconductor optical amplifier 800 having channel 802 and channel 804 configured to propagate different optical data signals. For example, channel 802 may receive a first optical data signal from photonic chip 150, generate a first amplified optical data signal, and transmit the first amplified optical data signal to photonic chip 150. Similarly, channel 804 may receive a second optical data signal from photonic chip 150, generate a second amplified optical data signal, and transmit the second amplified optical data signal to photonic chip 150. As shown in FIG. 8, channel 802 and channel 804 have configurations similar to semiconductor optical amplifier 300 shown in FIG. 3A and share reflector 110 and signal coupling facet 104.

Figure 8B:
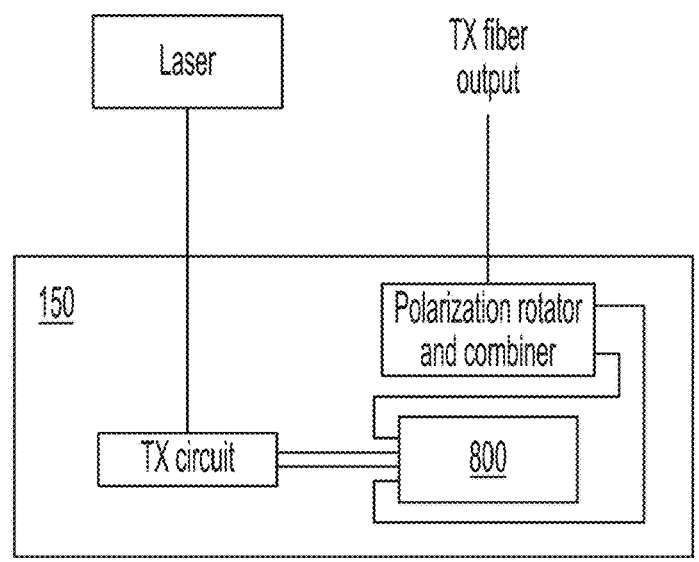
FIG. 8B is an optical system having a photonic chip and the semiconductor optical amplifier shown in FIG. 8A.

FIG. 8B is a schematic of an optical system that includes semiconductor optical amplifier 800 and photonic chip 150. Photonic chip 150 may be configured to transmit multiple optical data signals to semiconductor optical amplifier 800 through signal coupling facet 104 and receive multiple amplified optical data signals from semiconductor optical amplifier 800 through signal coupling facet 104. As discussed in connection with FIG. 1B, other photonic components may be formed on photonic chip 150 and one or more optical components may be located off of photonic chip 150. As shown in FIG. 8B, a polarization rotator and combiner is formed on photonic chip 150. The polarization rotator and combiner may be used to perform polarization multiplexing of the two output optical signals before transmitting them into an optical fiber.

It should be appreciated that although FIGS. 8A and 8B show two channels, any suitable number of channels may be formed on the same amplifier die. In addition, although channels 802 and 804 are shown in FIG. 8A as having the configuration shown in FIG. 3, it should be appreciated that any of the semiconductor optical amplifier configurations described herein may be used to form optical data signal amplifying channels.

Figure 9:
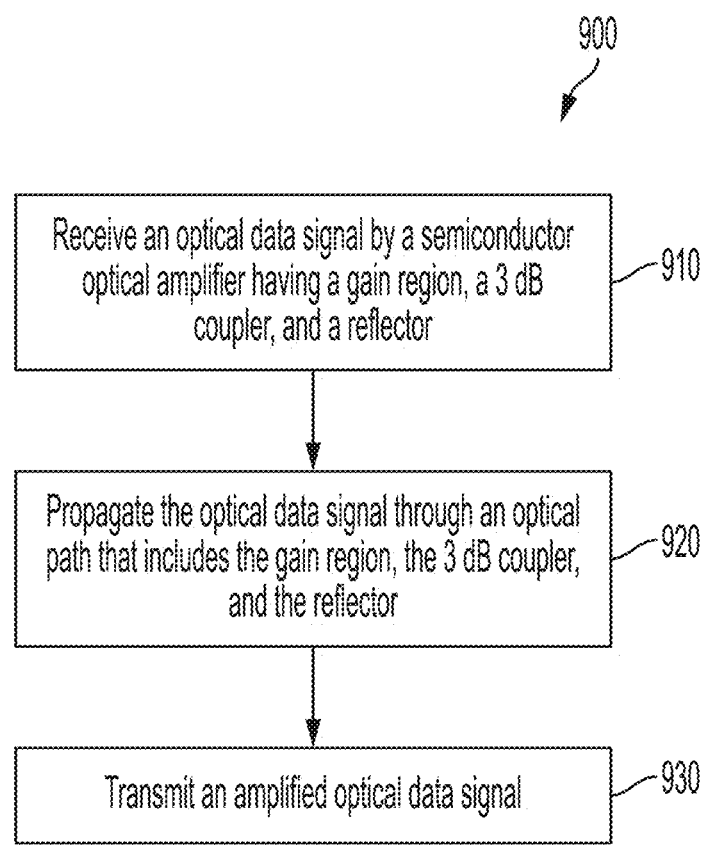
FIG. 9 is a flow chart of an illustrative process for amplifying an optical data signal using a semiconductor optical amplifier as described herein.

FIG. 9 is a flow chart of an illustrative process 900 for amplifying an optical signal using a semiconductor optical amplifier as described herein. The semiconductor optical amplifier has a gain region, a reflector, and a 3 dB coupler optically coupled to the gain region and the reflector. Process 900 begins at act 910, where an optical data signal is received by the semiconductor optical amplifier. In some embodiments, receiving the optical data signal includes inputting the optical data signal into a first waveguide of the gain region.

Next, process 900 proceeds to act 920, where the optical data signal is propagated through an optical path that includes the gain region, the 3 dB coupler, and the reflector to generate an amplified optical data signal. In some embodiments, propagating the optical data signal through the optical path further comprises propagating the optical signals through the 3 dB coupler towards the reflector and propagating the optical signals through the 3 dB coupler towards the gain region. Propagating optical signals through the 3 dB coupler may involve splitting optical signals between two branches of the 3 dB coupler so that each of the two branches receives approximately 50% of the optical signals. Propagating optical signals though the 3 dB coupler towards the gain region may involve combining optical signals propagating along two branches of the 3 dB coupler into a second waveguide of the gain region. In some embodiments, the optical signals propagating along the two branches have a phase shift difference of approximately $(4n-3)\pi/2$ where n is a positive integer.

Next, process 900 proceeds to act 930, where the amplified optical data signal is transmitted. In some embodiments, transmitting the amplified optical data signal includes outputting the amplified optical data signal from a second waveguide of the gain region.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The terms "approximately" and "about" may be used to mean within ±20% of a target value in some embodiments, within ±10% of a target value in some embodiments, within ±5% of a target value in some embodiments, within ±2% of a target value in some embodiments, and yet within ±1% of a target value in some embodiments. The terms "approximately" and "about" may include the target value.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

What is claimed is:

1. A semiconductor optical amplifier comprising:
   an amplifier die having a signal coupling facet;
   waveguides terminating at the signal coupling facet;
   a 3 dB coupler comprising a first branch and a second branch; and
   at least one reflector positioned at an end of the first branch and an end of the second branch, wherein the 3 dB coupler is optically coupled between the signal coupling facet and the at least one reflector.

2. The semiconductor optical amplifier of claim 1, further comprising a gain region between the 3 dB coupler and the signal coupling facet, wherein the amplifier die has a length between the signal coupling facet and an edge opposite the signal coupling facet, and the gain region is more than half of the length.

3. The semiconductor optical amplifier of claim 1, wherein a length of the waveguides between the signal coupling facet and the 3 dB coupler is more than half a dimension of the amplifier die.

4. The semiconductor optical amplifier of claim 1, wherein the waveguides are configured to be single-mode and the semiconductor optical amplifier is configured to propagate light in a single direction along the waveguides relative to the 3 dB coupler at least in a region between the signal coupling facet and the 3 dB coupler.

5. The semiconductor optical amplifier of claim 1, wherein the first branch and the second branch have a same optical path distance.

6. The semiconductor optical amplifier of claim 1, wherein the at least one reflector includes a first reflector and a second reflector, and the 3 dB coupler is optically coupled between the signal coupling facet and both the first reflector and the second reflector.

7. The semiconductor optical amplifier of claim 1, wherein the semiconductor optical amplifier further comprises an optical phase shifter optically coupled between the 3 dB coupler and the at least one reflector.

8. The semiconductor optical amplifier of claim 1, wherein the 3 dB coupler includes a first directional coupler, a second directional coupler, and an optical phase shifter optically coupled between the first directional coupler and the second directional coupler.

9. An optical system comprising:
a semiconductor optical amplifier comprising:
an amplifier die having a signal coupling facet;
waveguides terminating at the signal coupling facet;
at least one reflector on the amplifier die; and
a 3 dB coupler on the amplifier die comprising a first branch and a second branch, wherein the 3 dB coupler is optically coupled to the signal coupling facet and the at least one reflector, the at least one reflector positioned at an end of the first branch and an end of the second branch; and
a photonic chip configured to transmit an optical data signal to the signal coupling facet and receive an amplified optical data signal from the signal coupling facet.

10. The semiconductor optical amplifier of claim 9, further comprising a gain region between the 3 dB coupler and the signal coupling facet, wherein a portion of the waveguides in the gain region extend more than half a dimension of the amplifier die.

11. The semiconductor optical amplifier of claim 9, wherein the waveguides at the signal coupling facet are angled from a normal direction of the signal coupling facet.

12. The optical system of claim 9, wherein the 3 dB coupler is a first 3 dB coupler and the semiconductor optical amplifier further comprises a second 3 dB coupler on the amplifier die optically coupled between the signal coupling facet and the at least one reflector, wherein the first 3 dB coupler and the second 3 dB coupler are configured to receive different optical data signals from the signal coupling facet.

13. The optical system of claim 9, wherein the signal coupling facet has an anti-reflective coating.

14. The optical system of claim 9, wherein the at least one reflector is a reflective coating on an edge of the amplifier die opposite the signal coupling facet.

15. The optical system of claim 9, wherein the at least one reflector includes a first reflector and a second reflector, and the 3 dB coupler is optically coupled between the signal coupling facet and both the first reflector and the second reflector, wherein the first reflector and the second reflector are offset from an edge of the amplifier die.

16. A method of amplifying an optical signal comprising:
receiving an optical data signal by a semiconductor optical amplifier on a semiconductor die, the semiconductor optical amplifier having a gain region, at least one reflector, and a 3 dB coupler optically coupled to the gain region and the at least one reflector, wherein the 3 dB coupler comprises a first branch and a second branch, and wherein the at least one reflector is positioned at an end of the first branch and an end of the second branch;
propagating the optical data signal through an optical path that includes the gain region, the 3 dB coupler, and the at least one reflector to generate an amplified optical data signal; and
transmitting the amplified optical data signal off the semiconductor die.

17. The method of claim 16, wherein receiving the optical data signal further comprises inputting the optical data signal into a first waveguide of the gain region, propagating the optical data signal through the optical path further comprises propagating optical signals through the 3 dB coupler towards the at least one reflector and propagating reflected optical signals through the 3 dB coupler towards the gain region, and transmitting the amplified optical data signal further comprises outputting the amplified optical data signal from a second waveguide of the gain region.

18. The method of claim 17, wherein propagating optical signals through the 3 dB coupler further comprises splitting optical signals propagating along the first waveguide between the first branch and the second branch.

19. The method of claim 17, wherein propagating optical signals through the 3 dB coupler towards the gain region further comprises combining optical signals propagating along the first branch and the second branch into the second waveguide of the gain region.

20. The method of claim 19, wherein the optical signals propagating along the first branch and the second branch have a phase shift difference of $(4n-3)\pi/2$ where n is a positive integer.

21. The semiconductor optical amplifier of claim 1, wherein the waveguides, the 3 dB coupler, and the at least one reflector are formed on the amplifier die.

* * * * *